US006798185B2

United States Patent
Tanghe et al.

(12)

(10) Patent No.: US 6,798,185 B2
(45) Date of Patent: Sep. 28, 2004

(54) METHOD AND APPARATUS FOR TESTING ANALOG TO DIGITAL CONVERTERS

(75) Inventors: Steven J. Tanghe, Essex Junction, VT (US); Sharon L. Von Bruns, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 117 days.

(21) Appl. No.: 10/185,811

(22) Filed: Jun. 28, 2002

(65) Prior Publication Data

US 2004/0000899 A1 Jan. 1, 2004

(51) Int. Cl.[7] .................. G01R 13/14; H01H 31/02; H03M 1/10
(52) U.S. Cl. .................. 324/76.15; 324/537; 341/121; 326/94
(58) Field of Search ................ 324/76.15, 537; 341/120, 121; 326/94

(56) References Cited

U.S. PATENT DOCUMENTS

| 5,017,814 A | * | 5/1991 | Lloyd ......................... 327/198 |
| 5,856,800 A | * | 1/1999 | Le Pailleur et al. ......... 341/159 |
| 6,384,619 B1 | * | 5/2002 | Kim et al. .................... 326/21 |
| 6,603,415 B1 | * | 8/2003 | Somayajula ................. 341/118 |

\* cited by examiner

*Primary Examiner*—N. Le
*Assistant Examiner*—Timothy J. Dole
(74) *Attorney, Agent, or Firm*—Richard A. Henkler

(57) ABSTRACT

A method and apparatus for testing ADC circuitry. The method and apparatus detects infrequently occurring errors by providing a series of waveforms to the ADC that have different amplitude, frequency, or voltage offset from one another. The outputs of the ADC for the waveforms are then analyzed for timing related errors.

5 Claims, 4 Drawing Sheets

METHOD AND APPARATUS FOR TESTING ANALOG TO DIGITAL CONVERTERS

BACKGROUND

1. Technical Field of the Present Invention

The present invention generally relates to analog to digital converters, and more specifically, to methods and apparatuses for testing the analog to digital converters for errors.

2. Background of the Present Invention

In the world of semiconductors, the Analog to Digital Converter (ADC) plays the ever increasing and important role of converting analog data to a digital format for interpretation by digital circuitry. The speed with which these ADCs must convert the analog data has been increasing exponentially over the past several years. The use of ADCs at high speeds typically also requires very accurate results. It is this combination of high speed with very accurate results that causes various timing related problems from sources such as metastability-induced errors. In general, a metastability state refers to the state of a circuit where it hangs internally between a high and low state and is unable to make a strong decision on its state until some period of time has passed.

FIG. 1 represents a simplified block diagram of a conventional high speed n-bit flash ADC 100. The ADC 100 includes a bank of $2^n-1$ clocked comparators (Flash 104), Latches 116, and Pipelined encoding logic 114. The Flash 104 receives an analog signal and the bank of comparators (each comparing a differing voltage) produces a digital output to the Latches 116. In this example, the ADC 100 must deliver an n-bit encoded output with every clock cycle, and is therefore, pipelined (Pipelined encoding logic 114) to assist performance at high speeds.

As illustrated in FIG. 1, various clocks (clk1–4) are required for the various timing interfaces. The timing relationship between these clocks is difficult to design and simulate, and if not well aligned under all process and environment conditions will result in erroneous output codes. For example, if one of the comparators in Flash 104 has an input signal which is very close to its reference voltage, the comparator can enter a metastable state. Effects from the delay associated with this state can ripple through the encoding logic and, in the end, produce an incorrect ADC output code. Metastability problems are not limited to the comparators but can also occur in the Latches 116.

The Latches 116 that are used to capture the results provided by the comparators can also enter into a metastability state, independent of the comparators, with similar results. Of course, there are various ways in which the rate of metastability can be reduced or partially masked, but these never totally eliminate the occurrence.

Another kind of timing related problem for the ADC is similar to that seen in the digital logic domain, and depends on the data setup and hold times into the Latches 116. If the data is not held in a valid state during the critical window of time that the latch is being clocked, an error will occur. Verifying in simulation that the ADC is timed correctly is more difficult than in standard digital logic because the timing analysis tools must bridge the gap between digital and analog simulations.

There are several prior art methods used for testing the accuracy of an ADC. However, these methods fail to detect or reliably detect infrequently occurring errors.

It would, therefore, be a distinct advantage to have a method and system that could test the accuracy of an ADC and detect infrequently occurring errors. The present invention provides such a method and system.

SUMMARY OF THE PRESENT INVENTION

The present invention is method and apparatus for testing ADC circuitry. More specifically, the present invention detects infrequently occurring errors by providing a series of waveforms to the ADC that have different amplitude, frequency, or voltage offset from one another. The outputs of the ADC for the waveforms are then analyzed for timing related errors.

BRIEF DESCRIPTION OF THE DRAWINGS

The present invention will be better understood and its numerous objects and advantages will become more apparent to those skilled in the art by reference to the following drawings, in conjunction with the accompanying specification, in which.

DETAILED DESCRIPTION OF THE PREFERRED EMBODIMENT OF THE PRESENT INVENTION

In the following description, numerous specific details are set forth in order to provide a thorough understanding of the present invention. However, it will be obvious to those of ordinary skill in the art that the present invention can be practiced with different details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention, and are within the skills of persons of ordinary skill in the relevant art.

Figure 1:
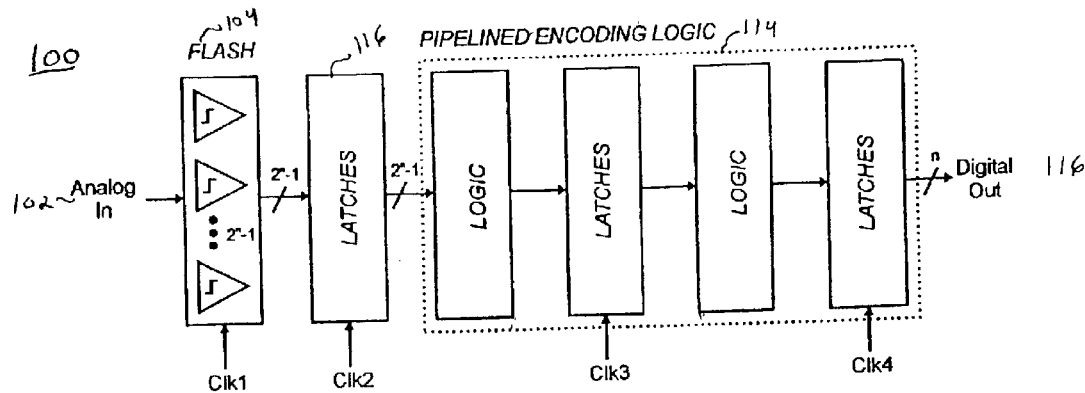
FIG. 1 is a simplified block diagram of a conventional high speed n-bit flash ADC.
Figure 2:
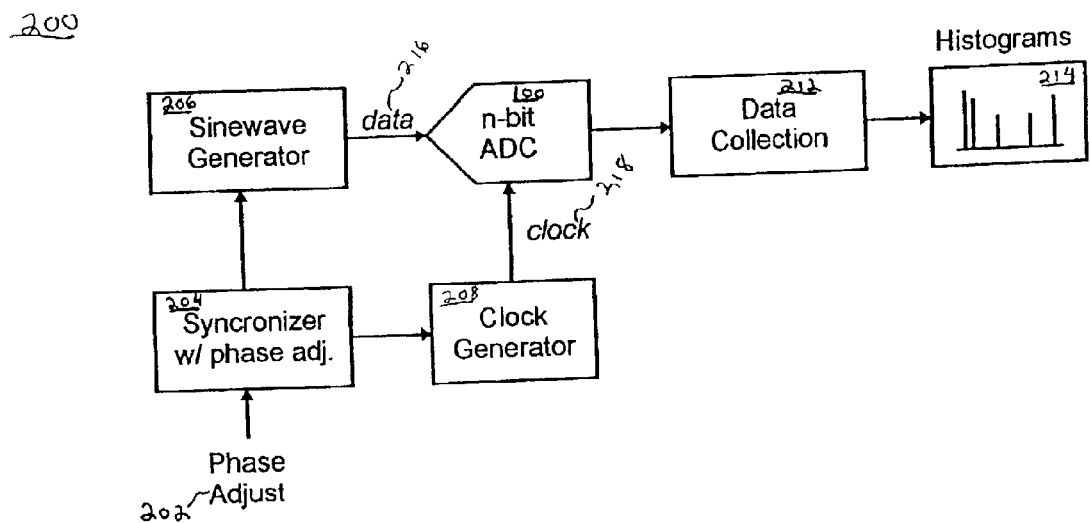
FIG. 2 is a block diagram illustrating a preferred embodiment of an apparatus for detecting errors in the ADC of FIG. 1 according to the teachings of the present invention.

Reference now being made to FIG. 2, a block diagram is shown illustrating a preferred embodiment of an apparatus 200 for detecting errors in the ADC 100 of FIG. 1 according to the teachings of the present invention. The apparatus includes a periodic waveform generator 206 (a sinewave in this embodiment), a Synchronizer 204 (including phase adjustment 202), a clock generator 208, the n-bit ADC 100 of FIG. 1, a data collection unit 212, and means for generating histograms 214.

The periodic waveform generator 206 provides a sinewave (data 216) to the ADC 100 that is synchronized with the clock signal 218 created with the clock generator 208 via the Synchronizer 204. The frequency of the data ($f_{data}$) is equal to some fraction of the frequency of the clock signal 218. The preferred embodiment of the present invention uses a ratio of $f_{data}/f_{clock}=0.25$. Those skilled in the art will readily recognize that the periodic waveform generator 206 and clock generator 208 can be either internal functions provided on an integrated circuit or provided by external circuitry to an integrated circuit.

The data collection unit 212 samples the digital output codes delivered by the ADC 100 in real time and stores them for post analysis. The data collection unit 212 can be implemented either internal to an integrated circuit or external (e.g. Using a digital oscilloscope or logic analyzer).

Figure 3:
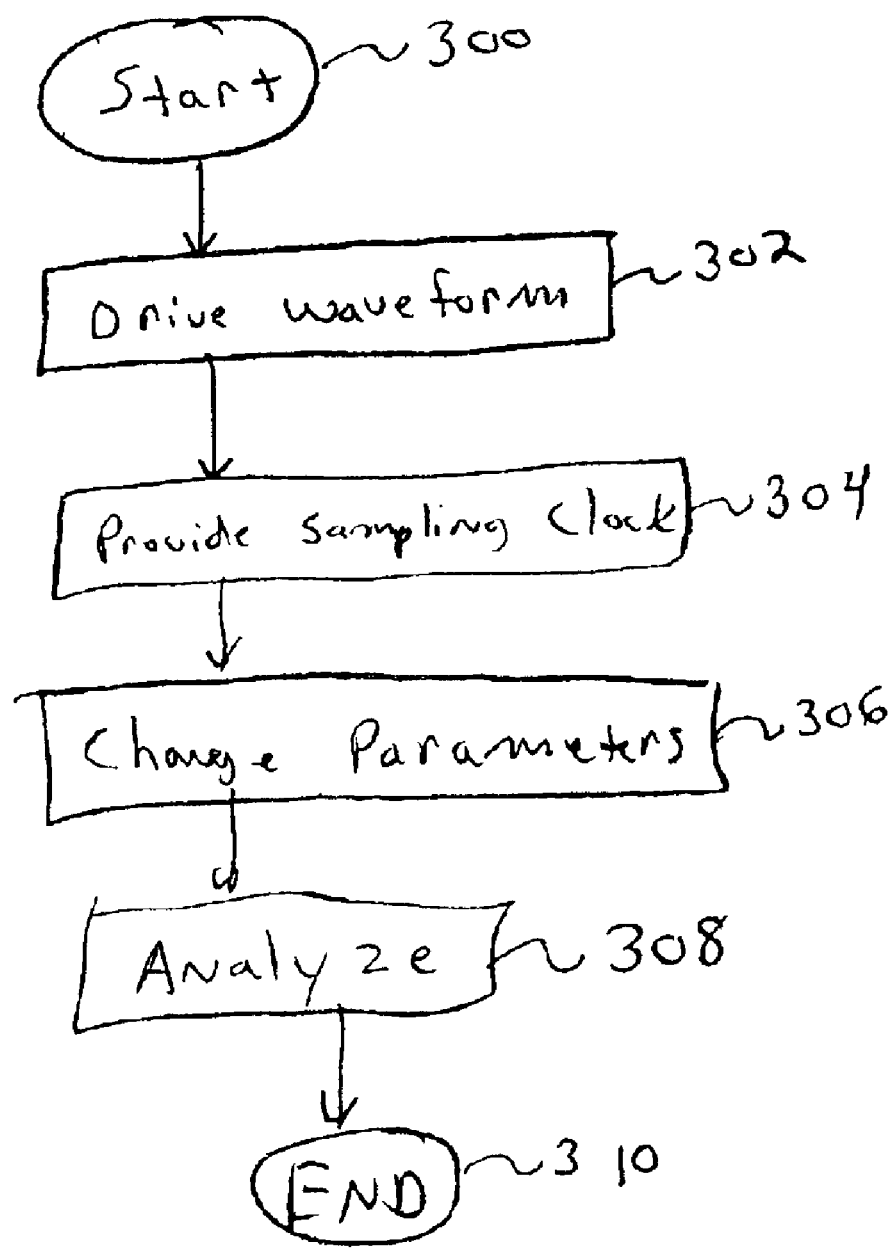
FIG. 3 is a flow chart illustrating the preferred method of using the apparatus of FIG. 2 according to the teachings of the present invention.

FIG. 3 is a flow chart illustrating the preferred method of using the apparatus of FIG. 2 according to the teachings of the present invention. The testing of the ADC 100 begins at 300 and proceeds by driving the ADC 100 with the periodic waveform generator 206 (step 302). The periodic waveform generator 206 would preferably generate a waveform (data) having adjustable amplitude, frequency, and offset that represents the particular range in which the ADC 100 is to be tested. The testing proceeds by providing the ADC 100 with a sampling clock via the clock generator 208. The sampling clock should have a frequency equal to some factor times the data rate frequency (i.e. Periodic waveform generator 206) (step 304). The Synchronizer 204 maintains clock synchronization between the periodic waveform generator 206 and the clock generator 208.

The testing continues by observing the outputs of the ADC 100 via the data collection unit 212 (step 306). While observing, the following parameters (or a subset) are altered to achieve the desired sampled codes:

1. Phase relation between the data and clock signal; and/or
2. Amplitude of the data; and/or
3. Direct Current offset of the data.

The testing is completed upon reviewing the stored results in a histogram 214 or other appropriate result oriented indicator (Steps 308 and 310).

Figure 4:
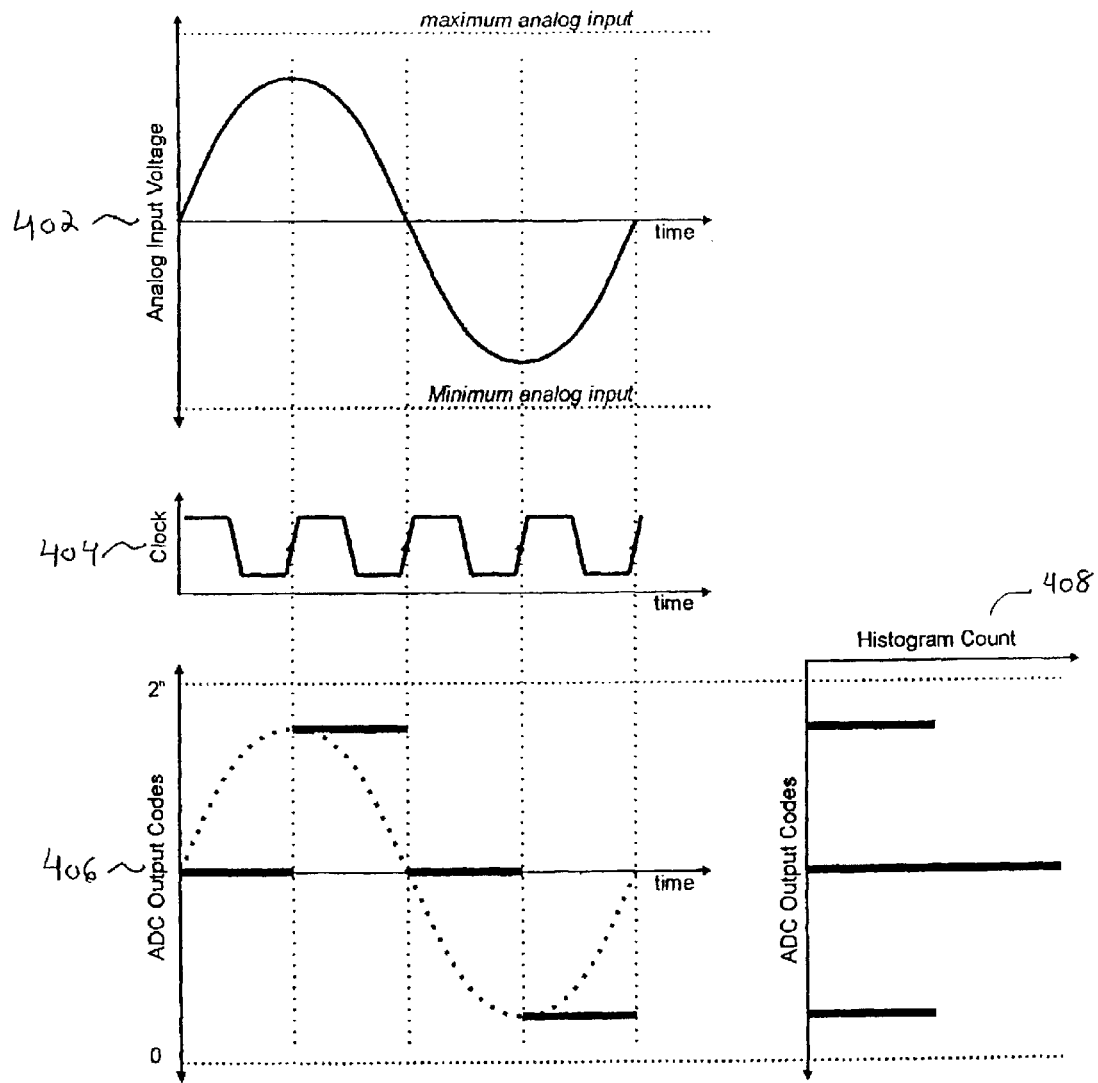
FIG. 4 is a diagram illustrating a first example using the apparatus of FIG. 2 according to the teachings of the present invention.

Reference now being made to FIG. 4, a diagram is shown illustrating a first example using the apparatus 200 of FIG. 2 according to the teachings of the present invention. In this example, the periodic waveform generator 206 generates a sinewave input to the ADC 100 that is centered in the input range of the ADC 100 as indicated by designation 402. The clock generator 208 generates a sampling clock that samples the input four times per data input cycle as indicated by designation 404. The sampling of the data signal produces the output codes of the ADC 100 as illustrated by designation 406. After many cycles (4) of collecting the output sample via data collection 212, the results can be displayed in histogram format as shown by the designation 408.

Figure 5:
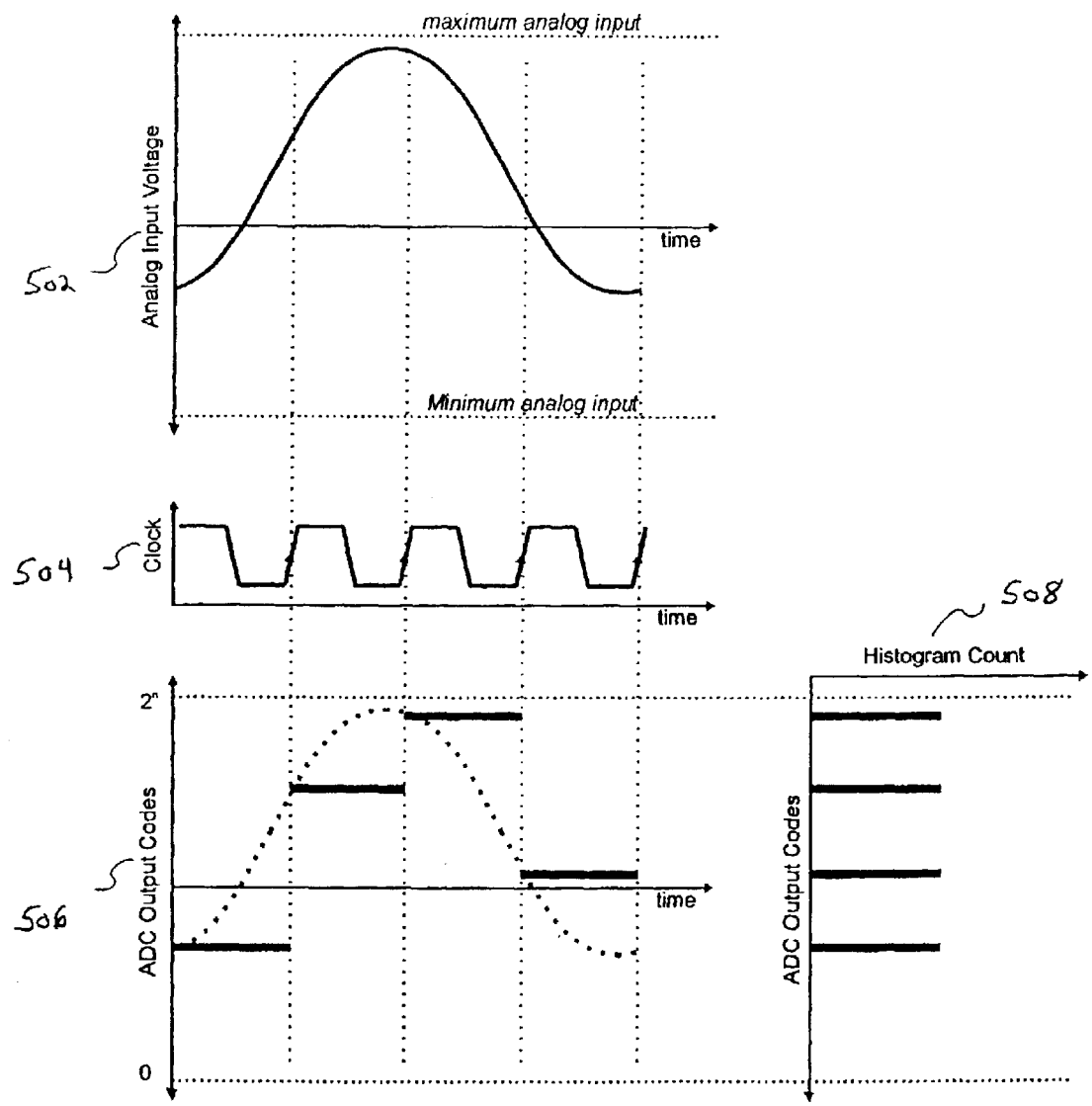
FIG. 5 is a diagram illustrating a second example using the apparatus of FIG. 2 according to the teachings of the present invention.

Reference now being made to FIG. 5, a diagram is shown illustrating a second example using the apparatus 200 of FIG. 2 according to the teachings of the present invention. In this particular example, the phase, amplitude, and offset of the sinewave have been altered from that illustrated in FIG. 4 such that the resulting sampling points (i.e. output of the ADC 210) are different. It should be noted that the sinewave frequency has not changed since it must keep a fixed relation with the output of the clock generator 208 to maintain the data groupings of the histogram.

By varying the three parameters of phase, amplitude, and offset, specific code sequences can be evaluated for timing errors. For example, consider a 6-bit ADC (n=6) where the output codes range from 0 to 63. Using the waveforms illustrated in FIG. 4, the sampled output code sequence will be something like 31–55–31–7 . . . However, shifting the phase, amplitude and offset to that shown in FIG. 5 will produce an output code sequence of 24–48–60–33.

Specific code patterns can be run and compared with simulations of those same patterns to look for marginal timings. In a further example, suppose that in simulation, one of the pipeline latches 114 is close to failing a setup times when the Input produces ADC 100 output codes that switch from a 55 to 31, and an erroneous code 23 would result if the setup time was not met. The example described in connection with FIG. 4 can be used to test this code transition. If several erroneous codes 23 appear in the histogram, the data supports the likelihood of a setup time problem at the suspected pipeline 114 latch. Similarly, testing the ADC 100 using the present invention can highlight an erroneous code 15 when switching between codes 31 and 7. Simulation of this code sequence can point to a path that is close to a hold time violation, with an erroneous code 15 resulting if the hold time was actually violated.

The histogram, oscilloscope persistence, and triggering on a level outside the expected range can be used to highlight and identify unexpected codes. The periodic waveform could have a very small amplitude, enough to cause transitions around a very tight code range, with a DC offset that can be varied to allow coverage of all code transitions. Temperature, power supply levels, and other variables can be manipulated to increase the probability of an infrequently occurring timing problem.

The method of forcing known code jumps is particularly useful for testing for metastability errors in the flash comparators 104 or their corresponding latches 116. Assuming for the moment that a 6-bit ADC 100 is being used, then for a given moment in time, only one of the 63 comparators has a significant probability of being metastable. This is the comparator with its inputs nearly balanced (i.e. the comparator at the decision boundary). If we consider a transition between adjacent codes like 47 and 48, then only one comparator is changing its output, the comparator driving a 48 which would change from a low to a high level. All of the comparators below 48 would remain high and all of the comparators above 48 would remain low. If the comparator (driving a 48) was metastable and flipped too late for the signal to ripple through the appropriate encoding logic within the allotted time, the ADC 100 would report a specific code in error that could be determined in a simulation of the encoding logic.

Now consider for the moment, a large jump in input corresponding to a jump in output codes of say 26 to 48. Again, after the input has completed the transition, only the comparator driving the 48 would be in danger of being metastable because its inputs are nearly balanced at the threshold. If this comparator flipped too late due to metastability, then the ADC 100 would behave the same way as described in the previous example above. Specifically, it would appear to be a late switch from a code 47 to a code 48, producing the same code in error as before. Thus, when metastability is concerned, it does not matter whether the outputs are switching between adjacent codes or across the whole range. It only matters what the target code is, and a metastable event at that code has associated with it a specific error code. This is different than if there was a setup or hold timing error at one of the pipeline latches. In that case, the starting code as well as the target code determine the error code that is produced.

It is thus believed that the operation and construction of the present invention will be apparent from the foregoing description. While the method and system shown and described has been characterized as being preferred, it will be readily apparent that various changes and/or modifications could be made without departing from the spirit and scope of the present invention as defined in the following claims.

What is claimed is:

1. A method of testing and characterizing an analog to digital converter with respect to metastability related timing errors, the method comprising the steps of:

providing a first analog input waveform to the analog to digital convertor;

providing a second analog input waveform to the analog to digital convertor, the second waveform having a different frequency, amplitude, or offset voltage than that of the first waveform;

generating a plurality of analog to digital converter output codes based on the first and the second analog input waveforms;

storing the output codes;

analyzing the output codes and reporting a failing output code in accordance with an expected simulation result;

identifying a first failing circuit component of the analog to digital converter corresponding to the failing cutout code; and implementing a circuit based timing solution for the failing output code.

2. The method of claim 1 further comprising the step of:

running the analog to digital convertor at its maximum operating frequency.

3. A method of testing and characterizing an analog to digital convertor and related circuitry for timing errors, the method comprising the steps of:

providing a first analog input waveform to the analog to digital convertor;

providing a second analog input waveform to the analog to digital convertor, the second waveform having an amplitude, frequency or offset different from that of the first waveform;

generating a plurality of analog to digital converter output codes based on the first and the second analog input waveforms;

storing the output codes;

analyzing the output codes and reporting a failing output code in accordance with an expected simulation output;

characterizing the failing output code as corresponding to a circuit that is sensitive to a variation in a power supply voltage, an operating temperature or a manufacturing process;

identifying a first failing circuit component of the analog to digital converter corresponding to the failing cutout code; and implementing a circuit based timing solution for the failing output code.

4. The method of claim 3 further comprising the step of:

running the analog to digital convertor at its maximum operating frequency.

5. An apparatus for testing an analog to digital convertor and related circuitry for timing errors, the apparatus comprising:

a signal generator for providing a plurality of analog input waveforms to the analog to digital convertor;

a synchronizer circuit to vary the frequency and phase of the second analog input waveform;

a data collection unit to store a plurality of output codes of the analog to digital converter generated by the first and second analog input waveforms;

a variable power supply coupled to the analog to digital converter to vary an offset voltage; and an output data analysis tool adapted to identify unexpected operating codes corresponding to the first and second analog input waveforms.

* * * * *